United States Patent
Kishimoto

(10) Patent No.: US 10,277,262 B2
(45) Date of Patent: Apr. 30, 2019

(54) COMMUNICATION MODULE

(71) Applicant: Murata Manufacturing Co., Ltd., Kyoto (JP)

(72) Inventor: Ken Kishimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/729,869

(22) Filed: Oct. 11, 2017

(65) Prior Publication Data

US 2018/0109275 A1    Apr. 19, 2018

(30) Foreign Application Priority Data

Oct. 17, 2016    (JP) ................................ 2016-203517

(51) Int. Cl.

| | |
|---|---|
| H04B 1/04 | (2006.01) |
| H03F 3/19 | (2006.01) |
| H03F 3/21 | (2006.01) |
| H03H 7/38 | (2006.01) |
| H04B 1/00 | (2006.01) |
| H03F 1/56 | (2006.01) |

(Continued)

(52) U.S. Cl.
CPC ............ *H04B 1/0483* (2013.01); *H03F 1/565* (2013.01); *H03F 3/19* (2013.01); *H03F 3/195* (2013.01); *H03F 3/21* (2013.01); *H03F 3/245* (2013.01); *H03F 3/72* (2013.01); *H03H 7/38* (2013.01); *H04B 1/0057* (2013.01); *H03F 2200/111* (2013.01); *H03F 2200/246* (2013.01); *H03F 2200/451* (2013.01); *H03F 2203/7209* (2013.01); *H03F 2203/7239* (2013.01); *H04B 2001/0408* (2013.01)

(58) Field of Classification Search
CPC .......... H04B 1/04; H04B 1/0483; H04B 1/02; H04B 1/03; H04B 1/0475
See application file for complete search history.

(56) References Cited

U.S. PATENT DOCUMENTS 7,522,887 B2 *   4/2009   Nagano .................. H04B 1/005
                                                                                                 455/62
2006/0229035 A1 *   10/2006   Fukamachi ............ G01R 21/10
                                                                                 455/114.1

(Continued)

FOREIGN PATENT DOCUMENTS

JP         2006-237978 A     9/2006

*Primary Examiner* — Blane J Jackson
(74) *Attorney, Agent, or Firm* — Pearne & Gordon LLP

(57) ABSTRACT

A communication module includes a first input terminal to which a first signal of a first frequency band is input, a second input terminal to which a second signal of a second frequency band is input, an amplifier that outputs an amplified signal which is obtained by amplifying the first signal, a diplexer that receives the amplified signal and/or the second signal and that outputs an output signal of the first and/or second frequency band, and a harmonic termination circuit that short-circuits a harmonic of the second signal. The harmonic termination circuit has an end connected between the second input terminal and the diplexer, and another end grounded at a ground position. A distance in plan view between the first input terminal and the ground position of the harmonic termination circuit is longer than a distance in plan view between the first input terminal and the second input terminal.

10 Claims, 6 Drawing Sheets

(51) Int. Cl.
*H03F 3/195* (2006.01)
*H03F 3/24* (2006.01)
*H03F 3/72* (2006.01)

(56) References Cited

U.S. PATENT DOCUMENTS

| | | | |
|---|---|---|---|
| 2009/0075608 A1* | 3/2009 | Ichitsubo | H04B 1/44 455/127.2 |
| 2009/0081975 A1* | 3/2009 | Powell | H04B 1/18 455/188.2 |
| 2009/0207764 A1* | 8/2009 | Fukamachi | H04B 1/44 370/297 |

* cited by examiner

COMMUNICATION MODULE

This application claims priority from Japanese Patent Application No. 2016-203517 filed on Oct. 17, 2016. The content of this application is incorporated herein by reference in its entirety.

BACKGROUND

The present disclosure relates to a communication module.

It is known that some communication modules for performing wireless transmission between wireless data communication devices support frequency bands for a plurality of different communication standards. For example, Japanese Unexamined Patent Application Publication No. 2006-237978 discloses a multiband high-frequency module that provides wireless transmission in the 5 GHz frequency band, which is used in wireless local area networks (LANs), and wireless transmission in the 2.4 GHz frequency band, which is used in wireless LANs or Bluetooth (registered trademark).

The 5 GHz frequency band is adjacent to the frequency of the second harmonic of the 2.4 GHz frequency band. Thus, it is important in, in particular, a communication module supporting both frequency bands to maintain isolation between communication channels of the frequency bands. In this regard, Japanese Unexamined Patent Application Publication No. 2006-237978 discloses an improvement in isolation characteristics between an output terminal for a reception signal and an input terminal for a transmission signal of one of the frequency bands. However, there is no mention of an improvement in isolation characteristics between input terminals for transmission signals of different communication systems. In the configuration disclosed in Japanese Unexamined Patent Application Publication No. 2006-237978, therefore, for example, if input terminals for transmission signals of different frequency bands are formed close to each other in order to support the reduction in the size of a communication module, the isolation characteristics between the input terminals can deteriorate.

BRIEF SUMMARY

Accordingly, the present disclosure provides a communication module with improved isolation characteristics between a plurality of input terminals.

According to embodiments of the present disclosure, a communication module includes a first input terminal to which a first signal of a first frequency band is input, a second input terminal to which a second signal of a second frequency band is input, an amplifier that outputs an amplified signal which is obtained by amplifying the first signal, a diplexer that receives the amplified signal and/or the second signal and that outputs an output signal of the first and/or second frequency band, and a harmonic termination circuit that short-circuits a harmonic of the second signal. The harmonic termination circuit has a first end connected between the second input terminal and the diplexer, and a second end grounded at a ground position. A distance in plan view between the first input terminal and the ground position of the harmonic termination circuit is longer than a distance in plan view between the first input terminal and the second input terminal.

According to embodiments of the present disclosure, it may be possible to provide a communication module with improved isolation characteristics between a plurality of input terminals.

Other features, elements, characteristics and advantages of the present disclosure will become more apparent from the following detailed description of embodiments of the present disclosure with reference to the attached drawings.

DETAILED DESCRIPTION

An embodiment of the present disclosure will be described in detail with reference to the drawings. The same or substantially the same elements are assigned the same numerals and are not described again.

Figure 1:
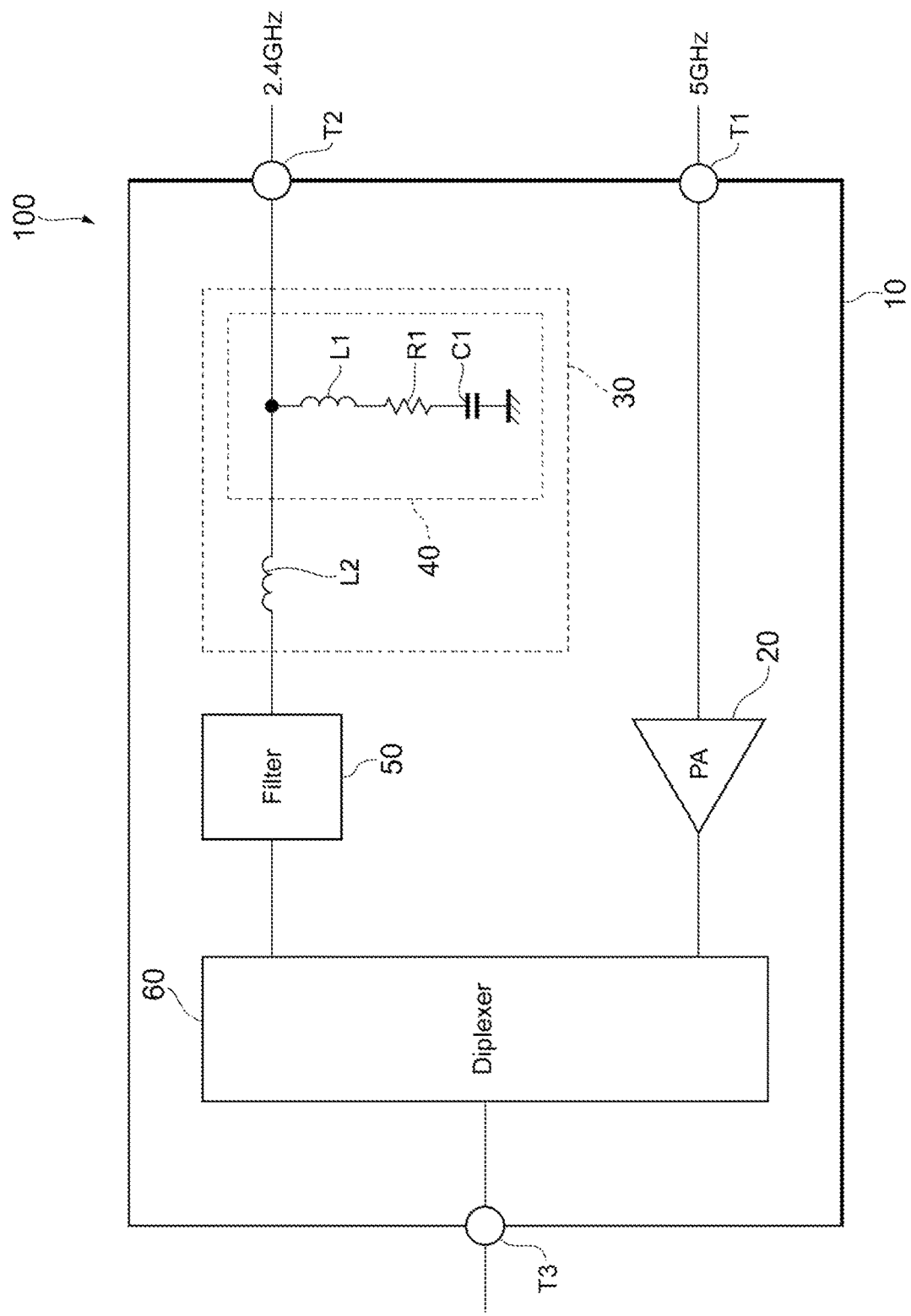
FIG. 1 illustrates an example configuration of a communication module according to an embodiment of the present disclosure.

FIG. 1 illustrates an example configuration of a communication module 100 according to an embodiment of the present disclosure. The communication module 100 is mounted in a wireless data communication device, for example, and is configured to amplify the power of a radio frequency (RF) signal and output the resulting signal. Although not illustrated in FIG. 1, the communication module 100 may include a receiving channel for processing a reception signal received by an antenna (not illustrated). The receiving channel is not described herein.

There are a plurality of communication standards for wireless data communication, and the communication standards use different frequency bands. For example, a communication standard such as the Institute of Electrical and Electronics Engineers (IEEE) 802.11a or IEEE 802.11h for wireless LANs uses the 5 GHz band. On the other hand, a communication standard such as IEEE 802.11b or IEEE 802.11g for wireless LANs or Bluetooth (registered trademark), which is suitable for short-range wireless data communication, uses the 2.4 GHz band. The communication module 100 supports a communication standard that uses the 5 GHz band (a first frequency band) (this communication standard is hereinafter referred to also as a first communication standard) and a communication standard that uses the 2.4 GHz band (a second frequency band) (this communication standard is hereinafter referred to also as a second communication standard). In the communication module 100, a channel for the first communication standard (this channel is hereinafter referred to also as a first channel) and a channel for the second communication standard (this channel is hereinafter referred to also as a second channel) are simultaneously operable. The communication module 100 may support any other communication standard.

Next, the components of the communication module 100 will be described. As illustrated in FIG. 1, the communication module 100 includes input terminals T1 and T2, an output terminal T3, an amplifier 20, a matching circuit 30, a harmonic termination circuit 40, a filter circuit 50, and a diplexer 60. The input terminals T1 and T2, the output terminal T3, the amplifier 20, the matching circuit 30, the harmonic termination circuit 40, the filter circuit 50, and the diplexer 60 are defined on a module substrate 10 of the communication module 100. The module substrate 10 can be a low temperature co-fired ceramic multilayer substrate or a resin substrate, for example.

The communication module 100 receives a transmission signal (a first signal) conforming to the first communication standard through the input terminal T1 (a first input terminal) and a transmission signal (a second signal) conforming to the second communication standard through the input terminal T2 (a second input terminal). The communication module 100 outputs the transmission signal conforming to the first or second communication standard to the antenna (not illustrated) through the output terminal T3. The antenna may be included in the communication module 100.

The amplifier 20 is an amplifier for amplifying the power of the transmission signal conforming to the first communication standard, and is configured to use a transistor (amplifier element). The transistor is, for example, a bipolar transistor such as a heterojunction bipolar transistor (HBT) or a field effect transistor (metal-oxide-semiconductor field effect transistor (MOSFET)). A transmission signal (amplified signal) conforming to the first communication standard that has been amplified by the amplifier 20 is output to the diplexer 60. In this embodiment, although not illustrated in FIG. 1, an amplifier mounted outside the communication module 100 amplifies the power of the transmission signal conforming to the second communication standard before the transmission signal is input to the input terminal T2. The amplifier for the second communication standard may be mounted on the communication module 100.

The matching circuit 30 is disposed between the input terminal T2 and the filter circuit 50. The matching circuit 30 matches impedance between the amplifier (not illustrated) for the second communication standard in the preceding stage and the filter circuit 50 in the subsequent stage. The matching circuit 30 also has a function of a low-pass filter (LPF) that allows the fundamental of the transmission signal conforming to the second communication standard to pass therethrough and that attenuates the harmonics (such as the second and third harmonics). Further, the matching circuit 30 removes the direct-current (DC) component of the transmission signal. Specifically, the matching circuit 30 includes the harmonic termination circuit 40, which is connected in parallel with the signal path, and an inductor L2, which is connected in series with the signal path. The configuration of the matching circuit is not limited to the illustrated one.

The harmonic termination circuit 40 is part of the matching circuit 30. Specifically, the harmonic termination circuit 40 includes an inductor L1 (an inductance element), a resistance element R1, and a capacitor C1 (a capacitance element), which are connected in series. The inductor L1 has an end connected between the input terminal T2 and the inductor L2, and another end connected to an end of the resistance element R1. The capacitor C1 has an end connected to the other end of the resistance element R1, and another end grounded. The order in which the inductor L1, the resistance element R1, and the capacitor C1 are connected is not limited to that described above, and the inductor L1, the resistance element R1, and the capacitor C1 may be connected in any order. The function of the harmonic termination circuit 40 will be described in detail below.

The filter circuit 50 is disposed between the matching circuit 30 and the diplexer 60. The filter circuit 50 has a function of a band pass filter (BPF) that allows the fundamental of the transmission signal conforming to the second communication standard to pass therethrough and that attenuates other frequencies. The filter circuit 50 may be a bulk acoustic wave (BAW) filter, for example.

The diplexer 60 receives the transmission signal conforming to the first communication standard, which is output from the amplifier 20, and/or the transmission signal conforming to the second communication standard, which is output from the filter circuit 50. The diplexer 60 outputs the transmission signal conforming to the first communication standard and/or the transmission signal conforming to the second communication standard (output signal) to the output terminal T3. The diplexer 60 is configured using, for example, an LPF or a BPF. Further, the diplexer 60 can separate a reception signal received by the antenna (not illustrated) into a reception signal conforming to the first communication standard (the first frequency band) and a reception signal conforming to the second communication standard (the second frequency band).

Prior to the description of the function of the harmonic termination circuit 40, a configuration is assumed in which the communication module 100 does not include the harmonic termination circuit 40. The module substrate 10 has a multilayer structure, for example, and includes a plurality of ground layers to which the ground potential is supplied. The impedance of the ground layers is ideally zero, but can be actually approximately several ohms ($\Omega$) in the high-frequency range, in particular. The plurality of ground layers are electrically connected to one another in any layer of the module substrate 10. Accordingly, a transmission signal conforming to one communication standard may leak into a communication channel for the other communication standard through the ground layers. Specifically, for example, the harmonics of the transmission signal conforming to the second communication standard flow into a ground layer through a capacitor included in a matching circuit and connected in parallel with the signal path. Capacitive coupling generated between the input terminal for the first communication standard and the ground layer may cause the harmonics to propagate to the input terminal for the first communication standard. Electromagnetic field coupling between the input terminals T1 and T2 may also cause the harmonics of the transmission signal conforming to the second communication standard to leak into the input terminal for the first communication standard. As described above, there is a problem in that the isolation characteristics between the input terminals T1 and T2 become poor.

Among the harmonics of the transmission signal conforming to the second communication standard, the second harmonic has a frequency (approximately 4.8 GHz) close to the frequency band (approximately 5 GHz) for the first communication standard. Thus, the second harmonic of the transmission signal conforming to the second communication standard and signals of nearby frequencies (hereinafter referred to also simply as the "second harmonic"), which have leaked into the channel for the first communication standard, are amplified by the amplifier 20 in the first channel, travel through the diplexer 60, and are transmitted from the antenna, which may result in noise of the transmission signal.

In the communication module 100 illustrated in FIG. 1, since the harmonic termination circuit 40 is included, the leakage of the harmonics of the transmission signal conforming to the second communication standard into the first channel is reduced. The harmonic termination circuit 40 is an inductor-capacitor (LC) series resonance circuit that includes the inductor L1 and the capacitor C1 which are connected in series. The impedance of the LC series resonance circuit is the lowest at a resonant frequency fo, which may cause selective flow of a signal of the resonant frequency fo. Thus, a signal of a specific frequency can be short-circuited. The resonant frequency fo of the LC series resonance circuit can be represented by fo=½π√LC, where L denotes the inductance and C denotes the capacitance. In this embodiment, the inductance of the inductor L1 and the capacitance of the capacitor C1 are adjusted so that the resonant frequency fo of the harmonic termination circuit 40 is equal to the frequency of the second harmonic (i.e., approximately 4.8 GHz). This allows the second harmonic of the transmission signal conforming to the second communication standard input from the input terminal T2 to selectively flow to ground. In this embodiment, the harmonic termination circuit 40 is arranged so that the position at which the second harmonic is propagated to ground is away from the input terminal T1. An arrangement of the harmonic termination circuit 40 will be described with reference to FIG. 2.

Figure 2:
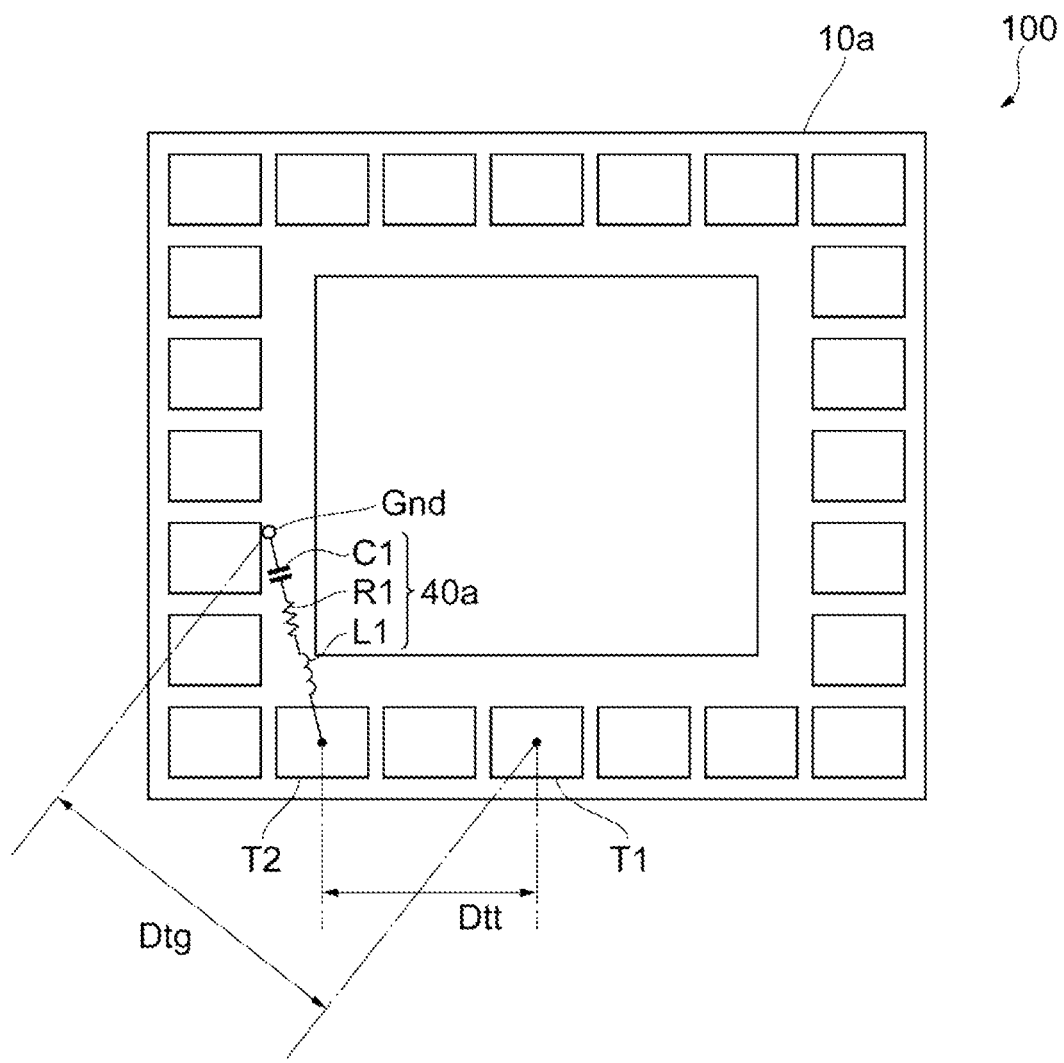
FIG. 2 schematically illustrates an example arrangement of a harmonic termination circuit in the communication module according to the embodiment of the present disclosure.

FIG. 2 schematically illustrates an example arrangement of a harmonic termination circuit 40a in the communication module 100 according to an embodiment of the present disclosure. In FIG. 2, only the components concerning the harmonic termination circuit 40 illustrated in FIG. 1 are illustrated, and other components are not illustrated. Further, the components illustrated in FIG. 1 are represented by numerals similar to those illustrated in FIG. 1, for convenience of illustration.

As illustrated in FIG. 2, the communication module 100 includes a plurality of terminals along a periphery thereof. The input terminal T1 for the first communication standard and the input terminal T2 for the second communication standard are arranged comparatively close to each other. The terminal between the input terminal T1 and the input terminal T2 may be a ground terminal, for example.

The harmonic termination circuit 40a has an end connected to the input terminal T2, and another end grounded at a ground position Gnd. The term "ground position", as used herein, refers to a position at which an element to be grounded (in FIG. 2, the capacitor C1) among the elements included in the harmonic termination circuit 40a is connected to a ground layer when the principal surface of a module substrate 10a is viewed in plan. For example, the module substrate 10a has a multilayer structure, and a plurality of ground layers are electrically connected via a via electrode. In this case, the position at which the capacitor C1 is first connected to a ground layer via the via electrode is the ground position. As illustrated in FIG. 2, the ground position Gnd of the harmonic termination circuit 40a is arranged away from the input terminal T1 when the module substrate 10a is viewed in plan. Specifically, the ground position Gnd of the harmonic termination circuit 40a is determined so that a distance Dtg between the input terminal T1 and the ground position Gnd (hereinafter referred to also simply as the ground distance Dtg) is longer than a distance Dtt between the input terminal T1 and the input terminal T2 (hereinafter referred to also simply as the terminal-to-terminal distance Dtt).

With the configuration described above, in the communication module 100, the second harmonic of a signal conforming to the second communication standard that travels through the harmonic termination circuit 40a is propagated to ground layers at the ground position Gnd, which is away from the input terminal T1 for the first communication standard. Thus, if the second harmonic is propagated to ground layers, the signal transmission distance over which the second harmonic is propagated to the input terminal T1 for the first communication standard is longer than that in a configuration that does not include the harmonic termination circuit 40, and the signal attenuation is increased. Accordingly, the leakage of the second harmonic propagated through ground layers is reduced. That is, even if it is difficult to increase the distance between the input terminals T1 and T2 because of a reduction in the size of the communication module 100, the isolation characteristics between the input terminals T1 and T2 are improved.

The harmonic termination circuit 40 further includes the resistance element R1, which is connected in series with the inductor L1 and the capacitor C1 (see FIG. 1). Thus, a signal is attenuated in accordance with the resistance value of the resistance element R1 when the signal travels through the resistance element R1. The impedance of the LC series resonance circuit is ideally zero at the resonant frequency fo, but is high at other frequencies. That is, the fundamental of the transmission signal conforming to the second communication standard is not affected by the resistance element R1, whereas the second harmonic is attenuated by the resistance element R1. Thus, it is possible to suppress the effect on the fundamental of the transmission signal conforming to the second communication standard and to selectively attenuate the second harmonic. The isolation characteristics between the input terminals T1 and T2 can further be improved. The resistance value of the resistance element R1 can be lower than the characteristic impedance (for example, approximately 50Ω) of a transmission line in the signal path (for example, a transmission line extending from the output terminal T3 of the communication module 100 and connected to the antenna). This is because if the resistance value of the resistance element R1 is higher than the characteristic impedance of the transmission line, the second harmonic will not be transmitted to the harmonic termination circuit 40. The harmonic termination circuit 40 may include no resistance element.

In the harmonic termination circuit 40, the inductance element may be a ferrite bead instead of the inductor L1.

The communication module 100 may include a coupler (directional coupler) between the diplexer 60 and the output terminal T3 and detect the signal level of a transmission signal to be transmitted from the diplexer 60 to the output terminal T3.

The simulation results of the isolation characteristics and insertion loss of the communication module 100 will be described with reference to FIGS. 3 to 6. The simulation results illustrated in each of FIGS. 3 to 6 are results regarding the signal attenuation between the input terminal T2 and the output terminal T3 or regarding the insertion loss of the harmonic termination circuit 40 when the signal paths for the first and second communication standards simultaneously operate. The terminal-to-terminal distance Dtt is assumed to be 0.8 mm.

Figure 3:
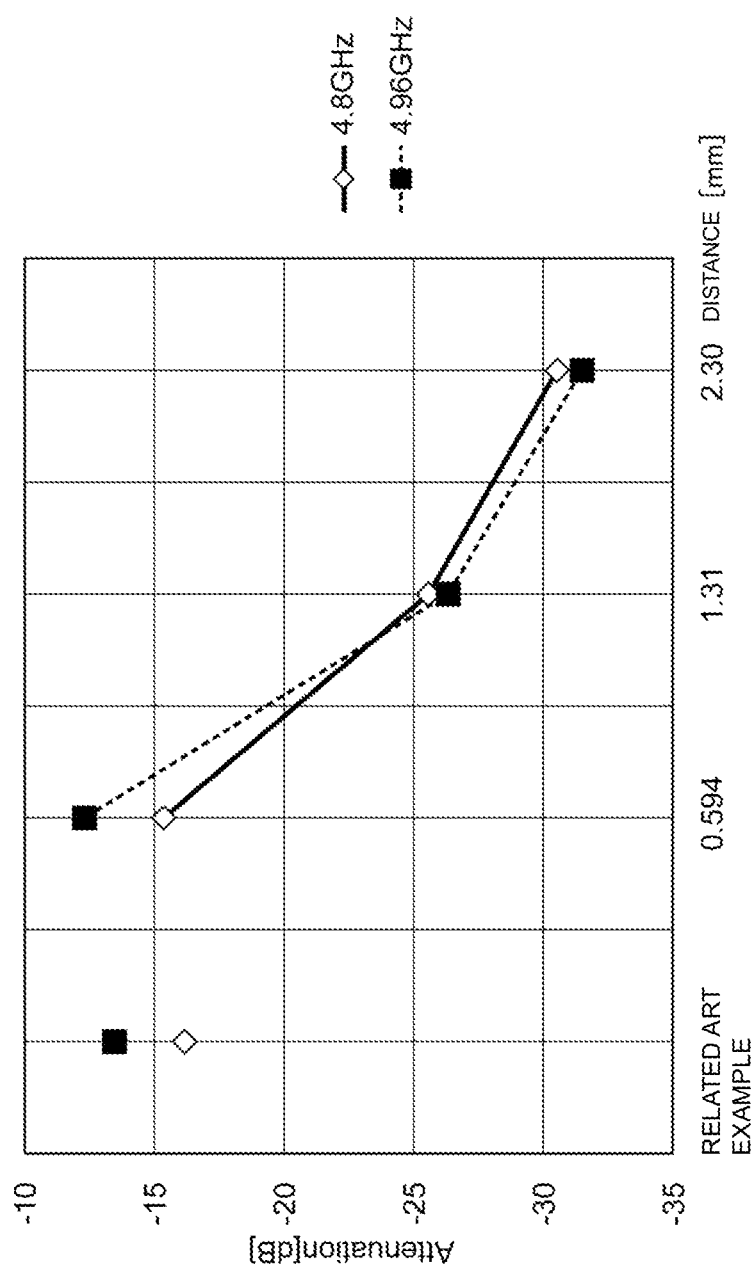
FIG. 3 is a graph illustrating simulation results of the relationship between a ground distance and an isolation characteristic in the communication module according to the embodiment of the present disclosure and a related art example.

FIG. 3 is a graph illustrating simulation results of the relationship between the ground distance Dtg and an isolation characteristic in the communication module 100 according to an embodiment of the present disclosure and a related art example. In the graph illustrated in FIG. 3, the vertical axis represents signal attenuation (dB), and the horizontal axis represents the ground distance Dtg (mm) illustrated in FIG. 2. In this simulation, signals having frequencies of 4.8 GHz (i.e., the frequency that is twice that of 2.4 GHz) and 4.96 GHz (i.e., a frequency that is about twice that of 2.4 GHz and that is close to the 5 GHz band) are used, the resistance value of the resistance element R1 is set to 0Ω, and the ground distance Dtg is set to 0.91 mm, 1.31 mm, and 2.30 mm. Results of the signal attenuation in this simulation are provided. In the related art example, the communication module 100 includes, instead of the harmonic termination circuit 40, a capacitor connected in parallel with the signal path.

As illustrated in FIG. 3, when the ground distance Dtg is 0.91 mm and is shorter than the terminal-to-terminal distance Dtt, the signal attenuation is approximately −12 to −15 dB and is approximately the same as the signal attenuation in the related art example in which the harmonic termination circuit 40 is not included. In contrast, when the ground distance Dtg is longer than the terminal-to-terminal distance Dtt, as can be seen from the results, the signal attenuation is larger and, for example, the signal attenuation is approximately −30 to −32 dB when the ground distance Dtg is 2.3 mm. As can be seen from the results, therefore, the signal attenuation of the second harmonic is increased by increasing the ground distance Dtg, resulting in an improvement in isolation characteristics between the input terminals T1 and T2.

Figure 4:
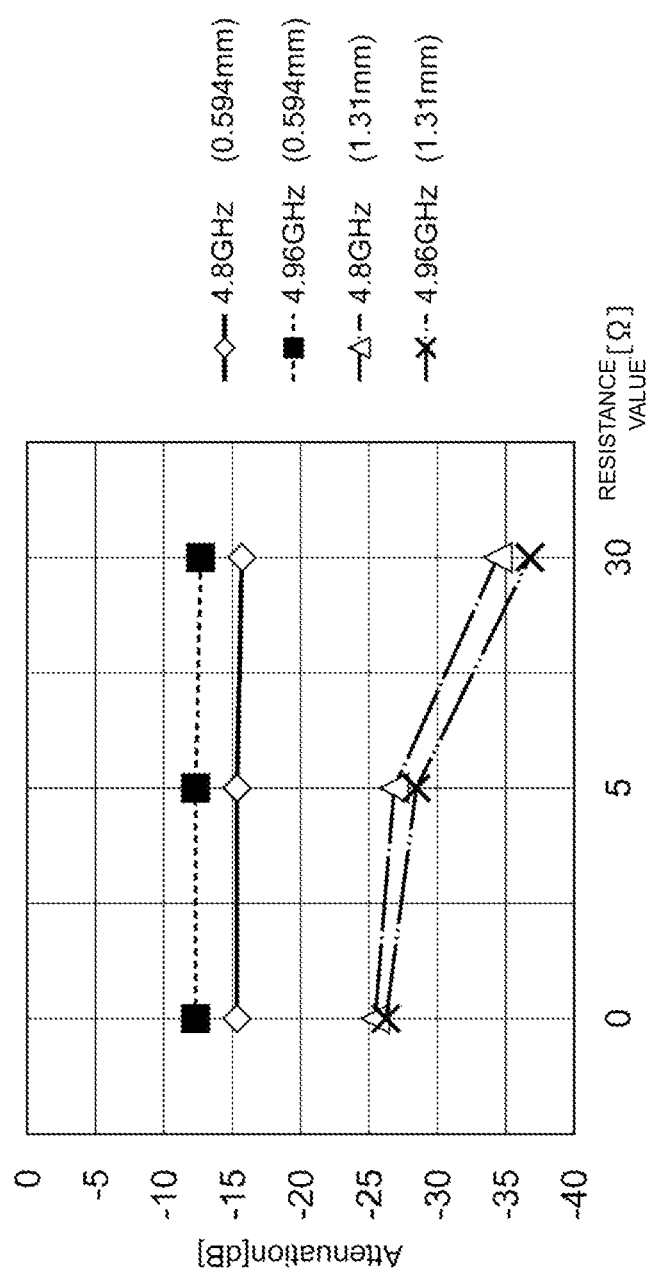
FIG. 4 is a graph illustrating simulation results of the relationship between the resistance value of a resistance element in the harmonic termination circuit and an isolation characteristic.

FIG. 4 is a graph illustrating simulation results of the relationship between the resistance value of the resistance element R1 and an isolation characteristic in the harmonic termination circuit 40. In the graph illustrated in FIG. 4, the vertical axis represents signal attenuation (dB), and the horizontal axis represents the resistance value (Ω) of the resistance element R1. In this simulation, signals having frequencies of 4.8 GHz and 4.96 GHz are used, the ground distance Dtg is set to 0.594 mm and 1.31 mm, and the resistance value of the resistance element R1 is set to 0 Ω, 5Ω, and 30Ω. Results of the signal attenuation in this simulation are provided.

As illustrated in FIG. 4, when the ground distance Dtg is 0.594 mm, the signal attenuation does not substantially change even if the resistance value of the resistance element R1 is increased. When the ground distance Dtg is 1.31 mm, in contrast, the signal attenuation is larger when the resistance value is 30Ω than when the resistance value is 5Ω. As can be seen from the results, therefore, as a result of the addition of the resistance element R1 to the harmonic termination circuit 40, the attenuation of the second harmonic and signals of nearby frequencies at the resistance element R1 is increased.

Figure 5:
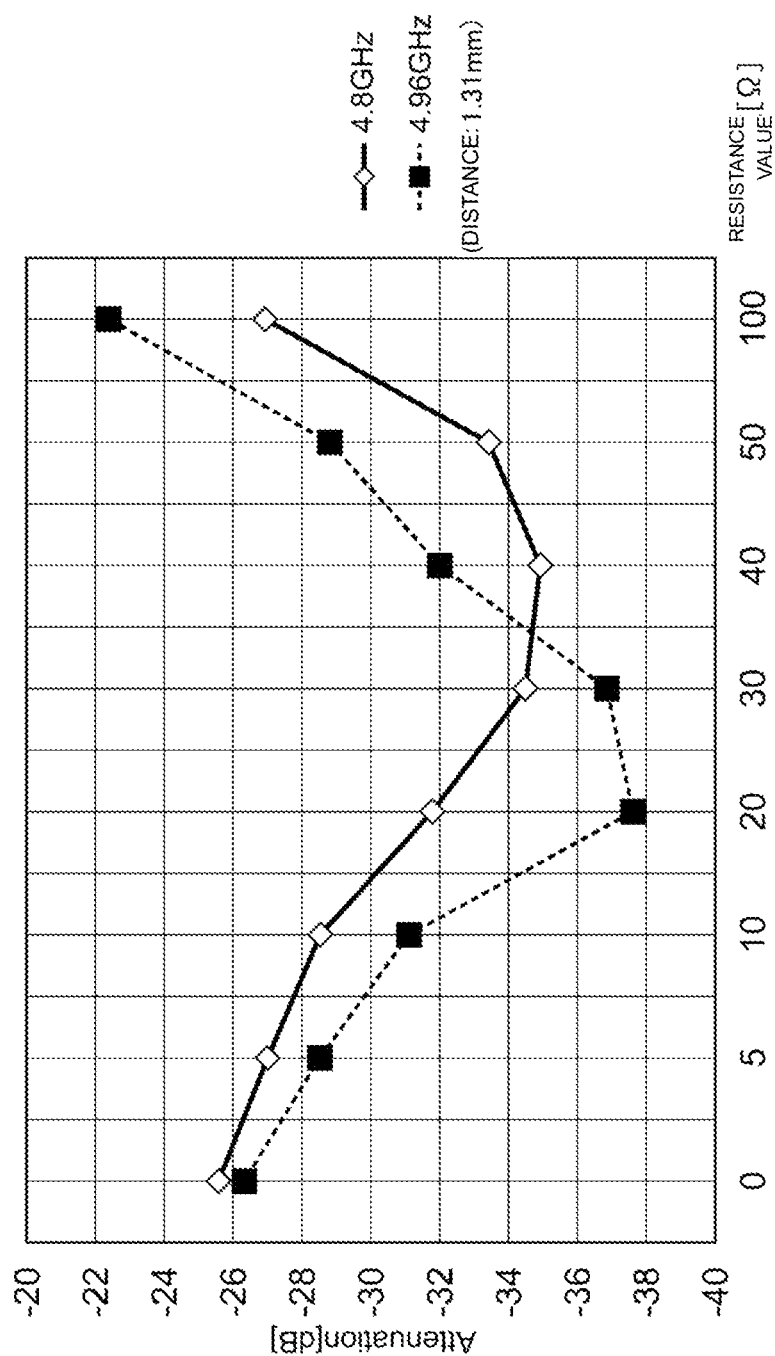
FIG. 5 is a graph illustrating simulation results of the relationship between the resistance value of the resistance element in the harmonic termination circuit and an isolation characteristic when the ground distance is 1.31 mm.

FIG. 5 is a graph illustrating simulation results of the relationship between the resistance value of the resistance element R1 and an isolation characteristic in the harmonic termination circuit 40 when the ground distance Dtg is 1.31 mm. In the graph illustrated in FIG. 5, the vertical axis represents signal attenuation (dB), and the horizontal axis represents the resistance value (Ω) of the resistance element R1. In this simulation, signals having frequencies of 4.8 GHz and 4.96 GHz are used, the ground distance Dtg is set to 1.31 mm, and the resistance value of the resistance element R1 is set to 0 Ω, 5 Ω, 10 Ω, 20 Ω, 30 Ω, 40 Ω, 50Ω, and 100Ω. Results of the signal attenuation in this simulation are provided.

As illustrated in FIG. 5, if the ground distance Dtg is constant, as can be seen from the results, the signal attenuation increases up to the value corresponding to 40Ω for the signal of 4.8 GHz and up to the value corresponding to 20Ω for the signal of 4.96 GHz in accordance with an increase in resistance value. In addition, regardless of the frequency, when the upper limit described above is exceeded, the signal attenuation decreases in accordance with an increase in resistance value. This is because a signal is less likely to flow through the harmonic termination circuit 40 when the resistance value excessively increases and becomes higher than, for example, 50Ω, which is the characteristic impedance of the transmission line of the communication module 100. In a situation where the harmonics of the transmission signal conforming to the second communication standard leak into the first channel, a signal (here, the signal of 4.96 GHz) nearer the 5 GHz band, which is a frequency band for the first communication standard, is more attenuated, thereby enabling a reduction in the effect of noise on the first channel. Thus, the resistance value of the resistance element R1 can be greater than or equal to about 20Ω and less than or equal to about 30Ω (see FIG. 5), for example.

Figure 6:
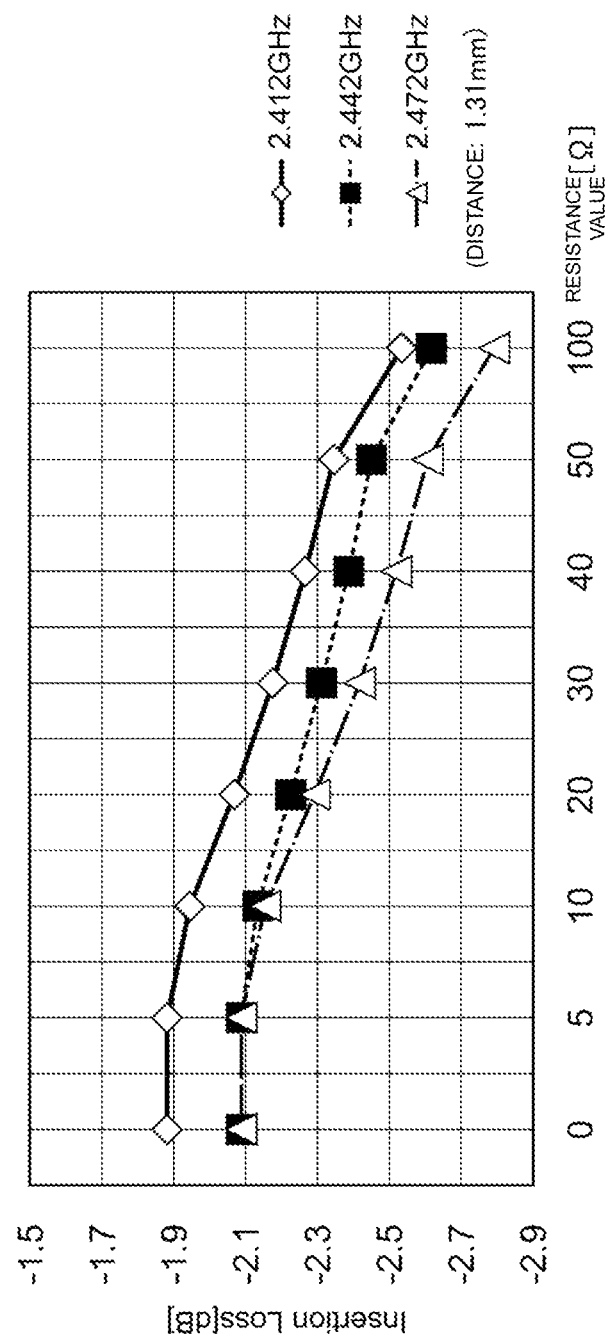
FIG. 6 is a graph illustrating simulation results of the relationship between the resistance value of the resistance element in the harmonic termination circuit and insertion loss when the ground distance is 1.31 mm.

FIG. 6 is a graph illustrating simulation results of the relationship between the resistance value of the resistance element R1 and insertion loss in the harmonic termination circuit 40 when the ground distance Dtg is 1.31 mm. In the graph illustrated in FIG. 6, the vertical axis represents insertion loss (i.e., one of the scattering parameters (S-parameters) of the output terminal T3 relative to the input terminal T2) (dB), and the horizontal axis represents the resistance value (Ω) of the resistance element R1. In this simulation, signals having frequencies of 2.412 GHz, 2.442 GHz, and 2.472 GHz are used, the ground distance Dtg is set to 1.31 mm, and the resistance value of the resistance element R1 is set to 0 Ω, 5 Ω, 10 Ω, 20 Ω, 30 Ω, 40 Ω, 50Ω, and 100Ω. Results of the insertion loss in this simulation are provided.

The results indicate that, as illustrated in FIG. 6, as the resistance value of the resistance element R1 increases, the insertion loss for the fundamental of a signal of the 2.4 GHz band, which is to be output from the communication module 100, increases. Accordingly, the resistance value of the resistance element R1 can be said to have trade-off relationships with the signal attenuation of the second harmonic and the insertion loss for the fundamental. Also in this regard, the resistance value of the resistance element R1 can be greater than or equal to about 20Ω and less than or equal to about 30Ω.

An illustrative embodiment of the present disclosure has been described. The communication module 100 includes the harmonic termination circuit 40 that short-circuits a harmonic of a signal of the second frequency band. In addition, the distance between the input terminal T1 for the first frequency band and the ground position of the harmonic termination circuit 40 is longer than the distance between the input terminal T1 and the input terminal T2 for the second frequency band. This configuration increases the signal transmission distance over which the second harmonic of a signal of the second frequency band is propagated to the input terminal T1, compared with a configuration that does not include the harmonic termination circuit 40. As a result, the attenuation of the signal is increased. Thus, the leakage of the second harmonic into the input terminal T1 through ground layers is reduced, and the isolation characteristics between the input terminals T1 and T2 are improved.

The harmonic to be short-circuited by the harmonic termination circuit 40 is not limited to any particular one.

For example, the second harmonic of a signal of the second frequency band (2.4 GHz) may be short-circuited.

The configuration of the harmonic termination circuit 40 is not limited to any particular one. For example, an LC series resonance circuit that includes the capacitor C1 and the inductor L1, which are connected in series, may be used.

The harmonic termination circuit 40 further includes the resistance element R1, which is connected in series with the capacitor C1 and the inductor L1. This configuration allows a signal to be attenuated in accordance with the resistance value of the resistance element R1 when the signal travels through the resistance element R1. Thus, the second harmonic of a signal conforming to the second communication standard can be selectively attenuated, and the isolation characteristics between the input terminals T1 and T2 can further be improved.

The resistance value of the resistance element R1 can be lower than the characteristic impedance of a transmission line, and can be greater than or equal to about 20Ω and less than or equal to about 30Ω. This configuration allows the second harmonic of a signal conforming to the second communication standard to be transmitted to the harmonic termination circuit 40 and can increase the signal attenuation at the resistance element R1. Accordingly, the isolation characteristics between the input terminals T1 and T2 can be further be improved.

The inductance element included in the harmonic termination circuit 40 is not limited to any particular one. For example, a ferrite bead may be used.

As illustrated in FIG. 1, furthermore, the communication module 100 may include the matching circuit 30, and the harmonic termination circuit 40 may be part of the matching circuit 30. The configuration of the matching circuit 30 and the harmonic termination circuit 40 is not limited to the illustrated one.

The matching circuit 30 is not limited to any particular one. For example, a low-pass filter that allows the fundamental of a signal of 2.4 GHz to pass therethrough and that attenuates the harmonics may be used.

The embodiment described above is intended for easy understanding of the present invention, and it is not intended to construe the present invention in a limiting fashion. Various modifications or improvements can be made to the present invention without departing from the gist of the present invention, and equivalents thereof are also included in the present invention. That is, the embodiment may be appropriately modified in design by those skilled in the art, and such modifications also fall within the scope of the present invention so long as the modifications include the features of the present invention. For example, the elements included in the embodiment and the arrangement, materials, conditions, shapes, sizes, and the like thereof are not limited to those described in the illustrated examples but can be modified as appropriate. In addition, the elements included in the embodiment can be combined as much as technically possible, and such combinations of elements also fall within the scope of the present invention so long as the combinations of elements include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A communication module comprising:
   a first input terminal to which a first signal of a first frequency band is input;
   a second input terminal to which a second signal of a second frequency band is input;
   an amplifier that amplifies the first signal, and outputs an amplified signal;
   a diplexer that receives the amplified signal and/or the second signal, and that outputs an output signal of the first and/or second frequency band; and
   a harmonic termination circuit that short-circuits a harmonic of the second signal,
   wherein the harmonic termination circuit has a first end connected between the second input terminal and the diplexer, and a second end grounded at a ground position, and
   wherein a distance between the first input terminal and the ground position is greater than a distance between the first input terminal and the second input terminal, the distances being in a plan view of the communication module.

2. The communication module according to claim 1, wherein the harmonic of the second signal is a second harmonic of the second signal, and
   wherein the first frequency band is about twice the second frequency band, such that the first frequency band is adjacent the second harmonic of the second signal.

3. The communication module according to claim 1, wherein the harmonic termination circuit comprises a capacitance element and an inductance element connected in series between the first end and the second end of the harmonic termination circuit.

4. The communication module according to claim 3, wherein the harmonic termination circuit further comprises a resistance element connected in series with the capacitance element and the inductance element between the first end and the second end of the harmonic termination circuit.

5. The communication module according to claim 4, wherein the resistance element has a resistance value less than a characteristic impedance of a transmission line in which the output signal is transmitted.

6. The communication module according to claim 4, wherein the resistance element has a resistance value greater than or equal to 20Ω and less than or equal to 30Ω.

7. The communication module according to any one of claim 3, wherein the inductance element is a ferrite bead.

8. The communication module according to claim 1, further comprising a matching circuit between the diplexer and the second input terminal,
   wherein the matching circuit comprises the harmonic termination circuit.

9. The communication module according to claim 8, wherein the matching circuit is a low-pass filter configured to allow a fundamental of the second signal to pass therethrough, and to attenuate a harmonic of the second signal.

10. The communication module according to claim 1, wherein the harmonic termination circuit is connected in parallel with a path of the second signal.

* * * * *